United States Patent
Lyon et al.

(10) Patent No.: US 10,827,283 B2
(45) Date of Patent: Nov. 3, 2020

(54) FLEXIBLE HEARING AID CIRCUIT WITH MOTHERBOARD AND PERIPHERAL ATTACHMENTS

(71) Applicant: Starkey Laboratories, Inc., Eden Prairie, MN (US)

(72) Inventors: Mark Lyon, Eden Prairie, MN (US); Susie Johansson, Eden Prairie, MN (US)

(73) Assignee: Starkey Laboratories, Inc., Eden Prairie, MN (US)

( * ) Notice: Subject to any disclaimer, the term of this patent is extended or adjusted under 35 U.S.C. 154(b) by 475 days.

(21) Appl. No.: 14/463,329

(22) Filed: Aug. 19, 2014

(65) Prior Publication Data

US 2016/0057546 A1 Feb. 25, 2016

(51) Int. Cl.
*H04R 25/00* (2006.01)
*H05K 1/14* (2006.01)
*H05K 3/36* (2006.01)

(52) U.S. Cl.
CPC .......... *H04R 25/00* (2013.01); *H04R 25/60* (2013.01); *H05K 1/147* (2013.01); *H04R 2225/021* (2013.01); *H04R 2225/025* (2013.01); *H05K 1/141* (2013.01); *H05K 3/363* (2013.01)

(58) Field of Classification Search
CPC .. H04R 25/556; H04R 25/608; H04R 25/602; H05K 1/189; H05K 3/325
See application file for complete search history.

(56) References Cited

U.S. PATENT DOCUMENTS

| | | | | |
|---|---|---|---|---|
| 4,694,120 A | * | 9/1987 | Accou | H05K 1/0284 174/255 |
| 5,204,917 A | | 4/1993 | Arndt et al. | |
| 5,420,758 A | * | 5/1995 | Liang | H01L 23/49811 361/813 |
| 5,557,075 A | * | 9/1996 | Nugent | H01R 35/02 174/254 |
| 5,789,815 A | * | 8/1998 | Tessier | H01L 23/3121 257/668 |

(Continued)

FOREIGN PATENT DOCUMENTS

| | | |
|---|---|---|
| DE | 3616773 A1 | 11/1987 |
| DE | 3842572 A1 | 6/1990 |

(Continued)

OTHER PUBLICATIONS

"European Application Serial No. 15181577.6, Extended European Search Report dated Nov. 11, 2015", 7 pgs.

(Continued)

*Primary Examiner* — Sean H Nguyen
(74) *Attorney, Agent, or Firm* — Schwegman Lundberg & Woessner, P.A.

(57) ABSTRACT

A hearing aid circuit includes a plurality of sub-circuits implemented as a plurality of flexible circuit boards. In various embodiments, the plurality of flexible circuit boards includes a motherboard that can be used with multiple hearing aid models and different peripheral boards that can provide different hearing aid models with their unique styles and/or functional features. In various embodiments, the hearing aid circuit is assembled in an automated process that connects the motherboard to one or more peripheral circuit boards using surface mount technology (SMT).

24 Claims, 12 Drawing Sheets

(56) References Cited

U.S. PATENT DOCUMENTS

| | | | | |
|---|---|---|---|---|
| 5,915,031 A * | 6/1999 | Hanright | ............ | H04R 25/556 381/322 |
| 6,456,720 B1 | 9/2002 | Brimhall et al. | | |
| 6,674,869 B2 | 1/2004 | Paczkowski | | |
| 7,577,967 B2 * | 8/2009 | Li | ............ | G11B 17/056 174/117 A |
| 7,712,210 B2 * | 5/2010 | Miller | ............ | H05K 1/117 156/289 |
| 8,150,084 B2 * | 4/2012 | Jessen | ............ | H04R 25/402 381/312 |
| 8,851,356 B1 * | 10/2014 | Holec | ............ | H05K 1/189 228/103 |
| 2003/0001287 A1 * | 1/2003 | Sathe | ............ | H01L 23/49811 257/780 |
| 2006/0123174 A1 * | 6/2006 | Nguyen | ............ | G07F 17/32 710/301 |
| 2009/0074216 A1 * | 3/2009 | Bradford | ............ | H04R 25/554 381/315 |
| 2012/0048589 A1 * | 3/2012 | Jol | ............ | H01R 13/521 174/59 |
| 2013/0335931 A1 * | 12/2013 | Snider | ............ | H05K 3/3436 361/751 |

FOREIGN PATENT DOCUMENTS

| | | |
|---|---|---|
| DE | 102012211277 A1 | 6/2013 |
| EP | 0927502 A1 | 3/1998 |
| EP | 0927502 B1 | 11/2001 |

OTHER PUBLICATIONS

"European Application Serial No. 15181577.6, Summons to Attend Oral Proceedings dated Jul. 16, 2019", 6 pgs.

* cited by examiner

FLEXIBLE HEARING AID CIRCUIT WITH MOTHERBOARD AND PERIPHERAL ATTACHMENTS

TECHNICAL FIELD

This document relates generally to electronic circuits and more particularly to a modular hearing aid circuit including a flexible circuit motherboard and one or more flexible circuit peripheral attachments.

BACKGROUND

Hearing aids are used to assist patients suffering hearing loss by transmitting amplified sounds to their ear canals. Modern hearing aids may employ digital electronics to enhance the wearers' listening experience. A hearing aid includes transducers and electro-mechanical components that are connected to electronic circuitry, which may include, but is not limited to, an analog-to-digital converter, a digital-to-analog convertor, a signal processor, and a memory device for processing audio signals, as well as power management and wireless communication circuits. In one example, a hearing aid is worn in and/or around a patient's ear. Patients generally prefer that their hearing aids are minimally visible or invisible and do not interfere with their daily activities. The demand for enhanced functionality and miniaturization of hearing aid circuitry increases the cost of manufacturing, especially if use of a multi-layer circuit board abstractly shaped to fit into a hearing aid shell is necessary. Therefore, there is a need for a cost-efficient approach for hearing aid electronics manufacturing.

SUMMARY

A hearing aid circuit includes a plurality of sub-circuits implemented as a plurality of flexible circuit boards. In various embodiments, the plurality of flexible circuit boards includes a motherboard that can be used with multiple hearing aid models and different peripheral boards that can provide different hearing aid models with their unique styles and/or functional features. In various embodiments, the hearing aid circuit is assembled in an automated process that connects the motherboard to one or more peripheral circuit boards using surface mount technology (SMT).

In one embodiment, a method for making a hearing aid is provided. A hearing aid circuit is constructed as a plurality of flexible circuit boards. The hearing aid circuit includes a plurality of sub-circuits. The flexible circuit boards each include a sub-circuit of the plurality of sub-circuits. Each flexible circuit board of the plurality of flexible circuit boards is connected to at least another flexible circuit board of the plurality of flexible circuit boards using SMT.

In one embodiment, a method for making electronic circuits for a plurality of different hearing aid models is provided. Motherboards each including a mother circuit constructed as a flexible circuit board are provided. The motherboards are common to the plurality of different hearing aid models. Peripheral board sets each including one or more peripheral circuits constructed as one or more flexible circuit boards are provided The peripheral board sets are each unique to a hearing aid model of the plurality of different hearing aid models. Each motherboard of the motherboards is connected with each peripheral board set of the peripheral board sets using SMT.

In one embodiment, a hearing aid includes a hearing aid circuit and a hearing aid case housing the hearing aid circuit. The hearing aid circuit includes a plurality of sub-circuits each constructed as a flexible circuit board of a plurality of flexible circuit boards. Each flexible circuit board of the plurality of flexible circuit boards is attached to at least another flexible circuit board of the plurality of flexible circuit boards using SMT.

This Summary is an overview of some of the teachings of the present application and not intended to be an exclusive or exhaustive treatment of the present subject matter. Further details about the present subject matter are found in the detailed description and appended claims. The scope of the present invention is defined by the appended claims and their legal equivalents.

DETAILED DESCRIPTION

Figure 1:
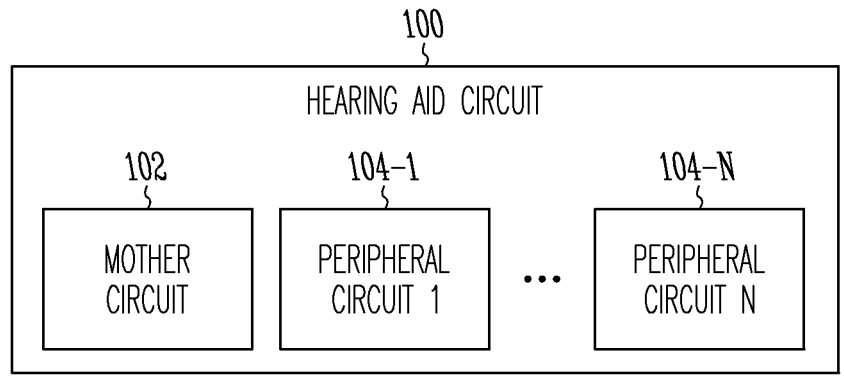
FIG. 1 is a block diagram illustrating an embodiment of a hearing aid circuit designed to be implemented as modular flexible circuit boards.

The following detailed description of the present subject matter refers to subject matter in the accompanying drawings which show, by way of illustration, specific aspects and embodiments in which the present subject matter may be practiced. These embodiments are described in sufficient detail to enable those skilled in the art to practice the present subject matter. References to "an", "one", or "various" embodiments in this disclosure are not necessarily to the same embodiment, and such references contemplate more than one embodiment. The following detailed description is demonstrative and not to be taken in a limiting sense. The scope of the present subject matter is defined by the appended claims, along with the full scope of legal equivalents to which such claims are entitled.

This document discusses, among other things, a modular circuit that includes two or more circuit boards attached to each other. In various embodiments, the circuit boards are attached to each other using surface mount technology (SMT). In various embodiments, the circuit boards include a motherboard and one or more peripheral boards. While discussed in this document in the context of hearing aids as a specific example, such a modular circuit may be used in any application employing flexible circuit technology.

In various embodiments, the two or more circuit boards include at least one circuit board constructed as a flexible circuit. In some embodiments, the two or more circuit boards are each a flexible circuit board. In this document, a flexible circuit includes an electronic circuit that is built on a flexible substrate such as a bendable film. A flexible circuit is also known in the art as a flex circuit or flexible electronics. Surface mount technology (SMT) includes an electronic circuit constructing method in which circuit components are directly mounted onto a surface of a printed circuit board, such as by pick and place followed by reflow soldering.

Flexible circuits have been used in hearing aids. However, due to geometrical constraints related to hearing aid cases (shells), the design and manufacturing of such flexible circuits may be expensive. Reasons for the high cost may include lengthy design time required for several hearing aid models in each hearing aid product family or generation and need for multi-layer circuit boards of abstract shapes. Each of new hearing aid models may need a flexible circuit custom designed to fit into its individual case style. A new flexible circuit design may take several weeks and frequently goes through numerous revisions. Each revision requires additional development time, meetings, flexible circuit prototyping, and numerous other resources. Additionally, this process creates numerous parts and part numbers that increase the cost of inventory management. In another example, the shape and size of a hearing aid case result in requirement for a flexible circuit with an abstract shape that may occupy a large amount of surface area when laid flat, thereby limiting the number of possible circuits that can fit onto each flexible circuit panel. In other words, the abstract shape may result in a significant under-utilization of panel space and hence cost inefficiency. The flexible circuit for a hearing aid may include complex parts that must be routed in three or four layers, as well as simple parts can be routed in one or two layers. The per panel cost for manufacturing the circuits increases with the number of layers, while the per circuit cost decreases with the number of circuits that can fit onto each panel.

There have been various approaches to improve cost efficiency by addressing such issues. In one example, a common flexible circuit board is designed to be shared by two or more standard hearing aid products. However, the goal of sharing the common flexible circuit board may be difficult to accomplish because of the diverse hearing aid design shapes, electrical requirements, and location of connection points. In a specific example, a common flexible circuit board is developed, but then needs to be altered for use in each hearing aid product, such as by removing one or more portions of the board. This results in wasted flexible circuit material as well as under-utilization of panel space. In another example, flexible circuit designs are redesigned, sometimes repeatedly, in an effort to fit more circuits per panel to improve cost efficiency. Such attempts usually result in only a few more circuits fitting onto each panel while requiring additional circuit design time, thus having very limited impact on the cost efficiency. In another example, a flexible circuit may be split into two or more parts to reduce complexity of circuit design and increase percentage of utilization of space per panel. The cost of hand assembly, however, may negate the benefits.

The present subject matter provides hearing aids with circuits each including modular circuit boards attached to each other in an automated assembly process using SMT. Various embodiments provide a "mother circuit" constructed as a "motherboard" and one or more peripheral circuits (also referred to as "arm circuit" or "limb circuit") constructed as one or more peripheral boards (also referred to as "arms", "arm boards", "limbs", or "limb boards"). In one embodiment, the motherboard is a common circuit design shared by two or more models of a hearing aid product family, and the one or more peripheral boards are unique to each model to provide that model with its unique physical and/or functional features. In various embodiments, the modular circuit boards include at least one flexible circuit board. In various embodiments, the modular circuit boards are each a flexible circuit board. The modular flexible circuit boards are designed such that the motherboard can be attached to the one or more peripheral boards in the automated assembly process. In some embodiments, the motherboard is multi-layer flexible circuit board with at least three layers and has a substantially rectangular outline, and the one or more peripheral boards are each a single-layer or two-layer flexible circuit board. While such embodiments are discussed in this document as specific examples, the present subject matter is not limited to flexible circuit applications and/or any particular numbers of layers. In various embodiments, the motherboard and the one or more peripheral boards may each be a single-layer rigid circuit, single-layer flexible circuit, multi-layer rigid circuit, or multi-layer flexible circuit.

The method of connecting a motherboard to one or more peripheral boards using SMT provides advantages of having separate, unique, and reusable sections for a single circuit while eliminating the need to assemble the circuit by hand. The modular approach allows for reuse of individual circuits in different hearing aid models, thereby saving design time. It also reduces the cost associated with the three-layer or four layer flexible circuits, as some circuits can instead use the less expensive single-layer or two-layer flexible circuits. Furthermore, the universal motherboard opens up the possibility of reusable inner spines, which reduces the time, effort and money spent on mechanical mold tooling. The use of the one or more peripheral boards increase the possibility of designing the motherboard for a substantially rectangular shape to increase the number of boards that can fit onto one panel, thereby increasing the cost efficiency.

FIG. 1 is a block diagram illustrating an embodiment of a hearing aid circuit 100 that is designed to be implemented as modular flexible circuit boards. Hearing aid circuit 100 includes a plurality of sub-circuits each to be implemented as one board of a modular flexible circuit board set for a hearing aid. In the illustrated embodiment, hearing aid circuit 100 includes a mother circuit 102 and peripheral circuits 104-1 to 104-N. In various embodiments, hearing aid circuit 100 includes one or more peripheral circuits, i.e., N≥1. In one embodiment, mother circuit 102 is designed for use in hearing aids of different models, and different sets of peripheral circuits 104-1 to 104N are designed for use in the hearing aids of different models, with each set unique to one of the different models to provide that model with its unique physical appearance and/or functionality.

Figure 2:
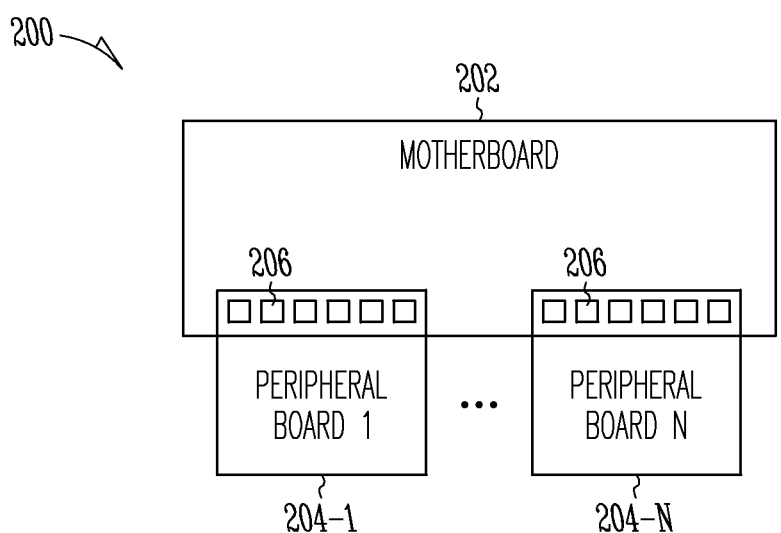
FIG. 2 is an illustration of an embodiment of a flexible circuit board assembly including the modular flexible circuit boards.

FIG. 2 is an illustration of an embodiment of a flexible circuit board assembly 200 that includes a plurality of flexible circuit boards. Each sub-circuit of the plurality of sub-circuits of hearing aid circuit 100 may be constructed as a flexible circuit board of the plurality of flexible circuit boards. Each flexible circuit board of the plurality of flexible circuit boards is attached to at least another flexible circuit board of the plurality of flexible circuit boards in using SMT in an automated assembly process.

In the illustrated embodiment, flexible circuit board assembly 200 includes the modular flexible circuit board set implementing mother circuit 102 and peripheral circuits 104-1 to 104-N of hearing aid circuit 100. Flexible circuit board assembly 200 includes a flexible motherboard 202 and flexible peripheral boards 204-1 to 204-N. In various embodiments, flexible circuit board assembly 200 includes one or more peripheral boards, i.e., N≥1. Mother circuit 102 is constructed as motherboard 202. Peripheral circuits 104-1 to 104-N are each constructed as one of peripheral boards 204-1 to 204-N. In various embodiments, motherboard 202 can be a single-layer or multi-layer flexible circuit board. In some embodiments, motherboard 202 is a multi-layer flexible circuit board having at least three layers. In one embodiment, motherboard 202 is a four-layer flexible circuit board. In various embodiments, motherboard 202 has an approximately rectangular shape or any other shape chosen to maximize the number of boards that can fit onto a flexible circuit panel for manufacturing. In various embodiments, peripheral boards 204-1 to 204-N can each be a single-layer or multi-layer flexible circuit board. In some embodiments, peripheral boards 204-1 to 204-N are each a single-layer flexible circuit board or a two-layer flexible circuit board. In one embodiment, peripheral boards 204-1 to 204-N are each a two-layer flexible circuit board. In various embodiments, each of peripheral boards 204-1 to 204-N is connected with motherboard using SMT, such as using reflow soldering at connection points (soldering spots) 206.

Figure 3:
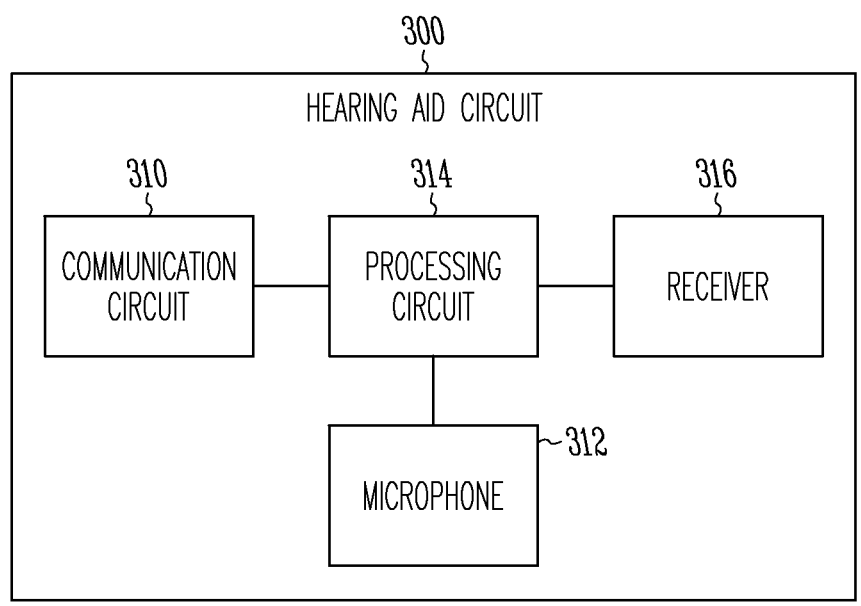
FIG. 3 is a block diagram illustrating an embodiment of the hearing aid circuit.

FIG. 3 is a block diagram illustrating an embodiment of a hearing aid circuit 300. In various embodiments, hearing aid circuit 300 is at least partially housed in a hearing aid case (shell) to form a hearing aid to be worn by a hearing aid wearer.

Hearing aid circuit 300 includes a microphone 312, a communication circuit 310, a processing circuit 314, and a receiver (also known as a speaker) 316. In various embodiments, at least microphone 312, communication circuit 310, and processing circuit 314 are housed in the case. Microphone 312 receives sounds from the environment of the hearing aid wearer. Communication circuit 310 allows the hearing aid to wirelessly communicate with another device, such as a programmer, another hearing aid, a hearing aid compatible telephone, or an audio streaming device, to receive programming and/or audio signals from that device. Processing circuit 314 processes the sounds received by microphone 312 and/or audio signals received by communication circuit 310 to produce output sounds. Receiver 316 transmits the output sounds to an ear canal of the hearing aid wearer.

In various embodiments, a substantial portion of hearing aid circuit 300 is designed as hearing aid circuit 100, i.e., designed to be implemented as modular flexible circuit boards. In various embodiments, hearing aid circuit 300 may also include components that are not to be implemented as part of the modular flexible circuit boards, depending on various design considerations and constraints. In various embodiments, a substantial portion of hearing aid circuit 300 is designed as mother circuit 102 and peripheral circuits and peripheral circuits 104-1 to 104-N, which are constructed as motherboard 202 and peripheral boards 204-1 to 204-N, respectively. In one embodiment, mother circuit 102 includes a substantial portion of processing circuit 314. In one embodiment, mother circuit 102 includes a substantial portion of processing circuit 314 and a substantial portion of communication circuit 310. In one embodiment, the substantial portion of processing circuit 314 included in mother circuit 102 includes a digital signal processor (DSP).

Figure 4:
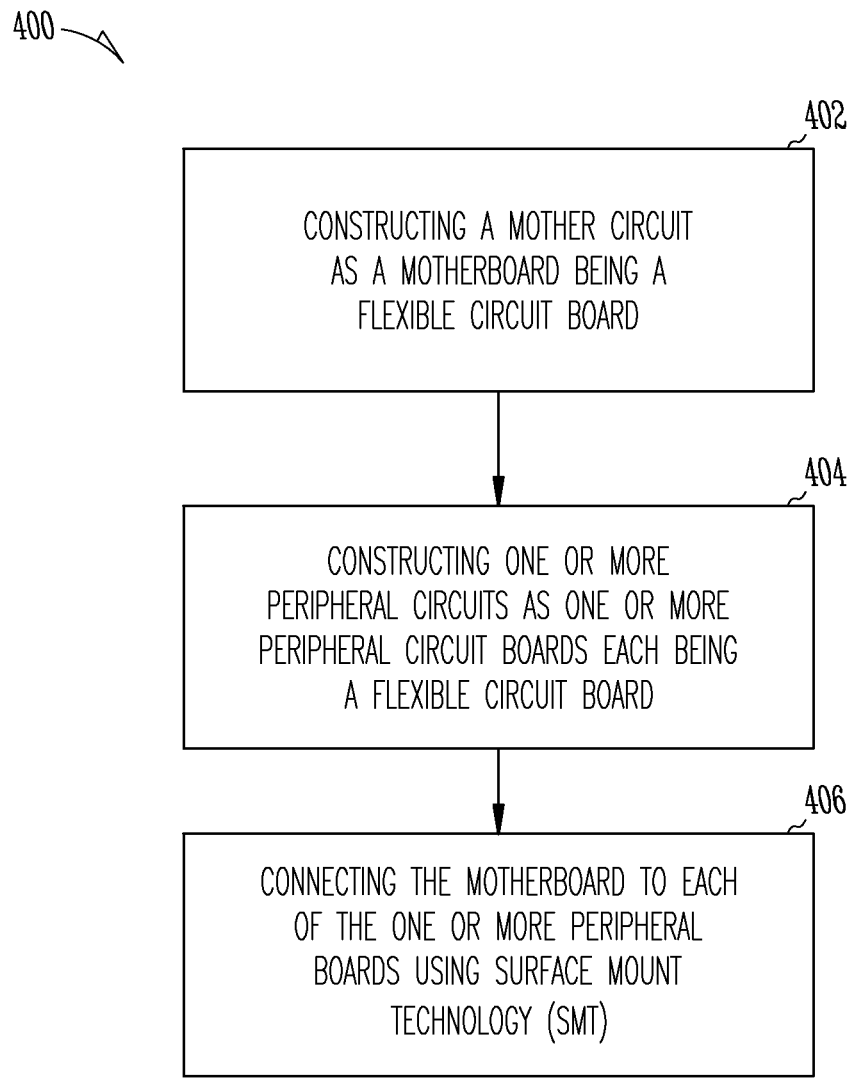
FIG. 4 is a flow chart illustrating an embodiment of a method for making a hearing aid circuit.

FIG. 4 is a flow chart illustrating an embodiment of a method 400 for making a hearing aid circuit. The hearing aid circuit includes a plurality of sub-circuits to be constructed as a plurality of flexible circuit boards. In various embodiments, method 400 is implemented as an automated assembly method. In various embodiments, method 400 is applied to implement hearing aid circuit 100 as flexible circuit board assembly 200.

At 402, a mother circuit of the plurality of sub-circuits is constructed as a motherboard of the plurality of flexible circuit boards. In various embodiments, the motherboard is a single-layer or multi-layer flexible circuit board. In some embodiments, the motherboard is a multi-layer flexible circuit board including at least three layers. In one embodiment, the mother circuit is a four-layer flexible circuit board. At 404, one or more peripheral circuits of the plurality of sub-circuits are constructed as one or more peripheral circuit boards of the plurality of flexible circuit boards. In various embodiments, the one or more peripheral circuit boards are each a single-layer or multi-layer flexible circuit board. In some embodiments, the one or more peripheral circuit boards are each a one-layer flexible circuit board or a two-layer flexible circuit board. In one embodiment, the one or more peripheral circuit boards are each a two-layer flexible circuit board. At 406, the motherboard is connected to each board of the one or more peripheral boards using SMT. In one embodiment, the one or more peripheral circuit boards are laid out on a flexible circuit panel in a way that forms a framework upon which the motherboard can rest. In one embodiment, the automated assembly process includes applying solder paste to connection points on the one or more peripheral boards, placing the motherboard on the framework such that connection points on the motherboard are aligned with the connection points on the one or more peripheral boards, and applying heat to at least the connection points such that the motherboard is attached to the one or more peripheral boards by reflow soldering. In other embodiments, the automated assembly process may include connecting the motherboard to the one or more peripheral boards using conductive epoxy curing or any other electrical attachment methods suitable for use in SMT.

While the embodiment of a motherboard and one or more peripheral boards are discussed as a specific example, method 400 can be applied for constructing a hearing aid circuit as a plurality of flexible circuit boards, where the hearing aid circuit includes a plurality of sub-circuits, and the flexible circuit boards each include a sub-circuit of the plurality of sub-circuits, regardless of the specific partitioning of the hearing aid circuit. Each flexible circuit board of the plurality of flexible circuit boards is connected to at least another flexible circuit board of the plurality of flexible circuit boards in an automated assembly process using SMT.

FIGS. 5-9 illustrate a specific example of step 406 of method 400 applied to automatically assemble a hearing aid circuit by attaching a four-layer flexible motherboard to a set of two-layer peripheral boards using SMT. This SMT automation is made possible by applying a unique concept of having the set of peripheral boards configured such that the separate appendages provide a framework on which the motherboard may be accurately placed. After the motherboard rests upon the framework, it is electrically attached to the set of peripheral boards by reflow soldering at the resting points. During the process, the motherboard can be picked and placed via SMT assembly techniques, and no hand assembly is necessary.

Figure 5:
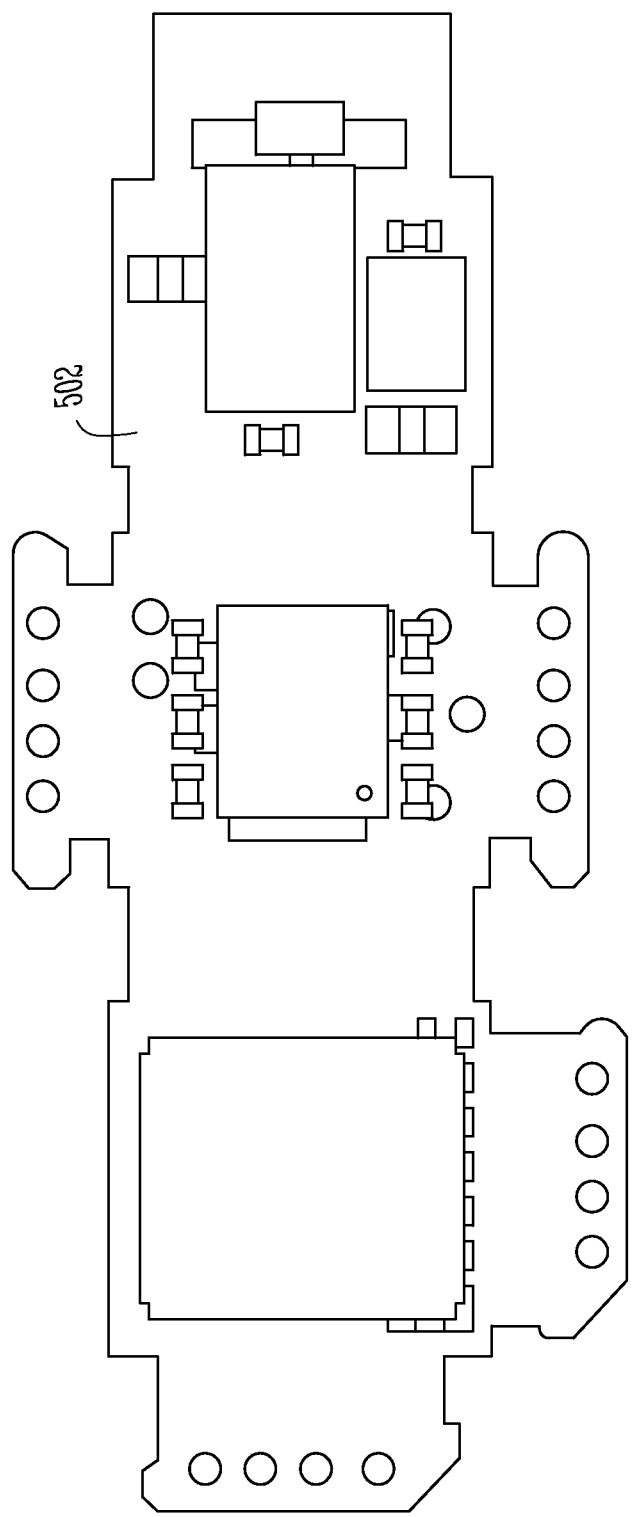
FIG. 5 is an illustration of an embodiment of a mother circuit of the hearing aid circuit constructed as a motherboard.

FIG. 5 is an illustration of an embodiment of a mother circuit of the hearing aid circuit constructed as a motherboard 502, as an example of mother circuit 102 constructed as motherboard 202. Mother circuit 502 is a four-layer flexible circuit board that contains the majority of the electronics for a hearing aid, including a DSP, a memory and a radio chip for example. Motherboard 502 has short flaps in place of full limbs to be used for electrical connections to the peripheral boards. It is approximately rectangular in shape, allowing more circuits per flexible circuit panel, thereby reducing the cost per panel.

Figure 6:
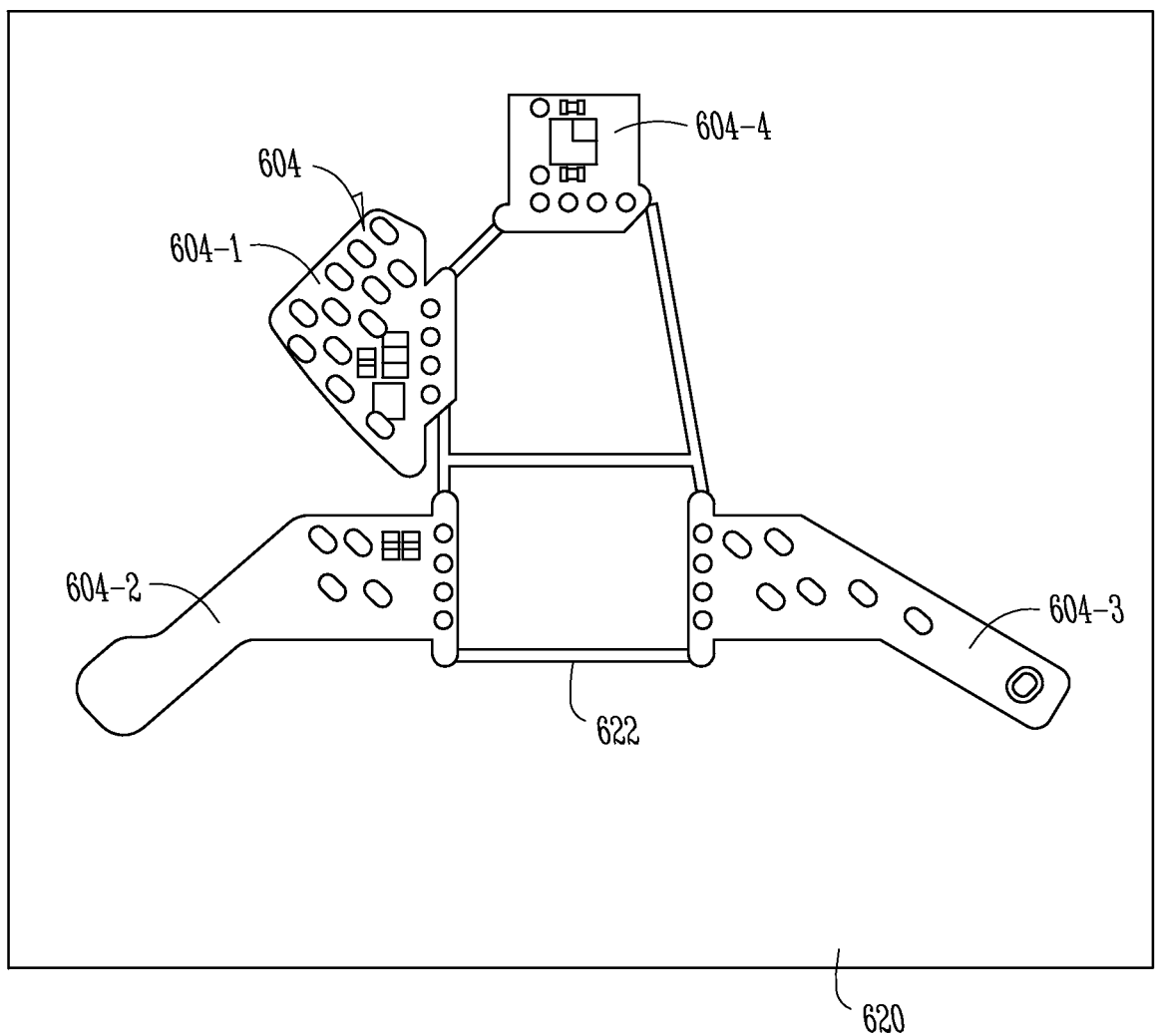
FIG. 6 is an illustration of an embodiment of a set of peripheral circuits of the hearing aid circuit constructed as a set of peripheral boards on a flexible circuit panel.

FIG. 6 is an illustration of an embodiment of a set of peripheral circuits of the hearing aid circuit constructed as a set of peripheral boards 604 on a flexible circuit panel 620, which is a two-layer flexible circuit panel. The set 604 includes peripheral boards 604-1, 604-2, 604-3, and 604-4 is an example of peripheral circuits 104-1 to 104-N constructed as peripheral boards 204-1 to 204-N (where N=4). Peripheral boards 604 may contain transducers, battery contacts, wired programming, and/or antenna contacts. Peripheral boards 604 are laser routed on panel 620 such that each of peripheral boards 604 is attached to panel 620 via a plurality of non-laser-routed tabs. These tabs are sparingly spaced around the perimeter of each of the peripheral boards 604 such that the boards are each barely attached to panel 620. A cross member support 622 includes segments each bridges between two of the peripheral boards 604, thus allowing each of peripheral boards 604 to remain supported by panel 620, as well as allowing peripheral boards 604 to communicate with each other.

Figure 7:
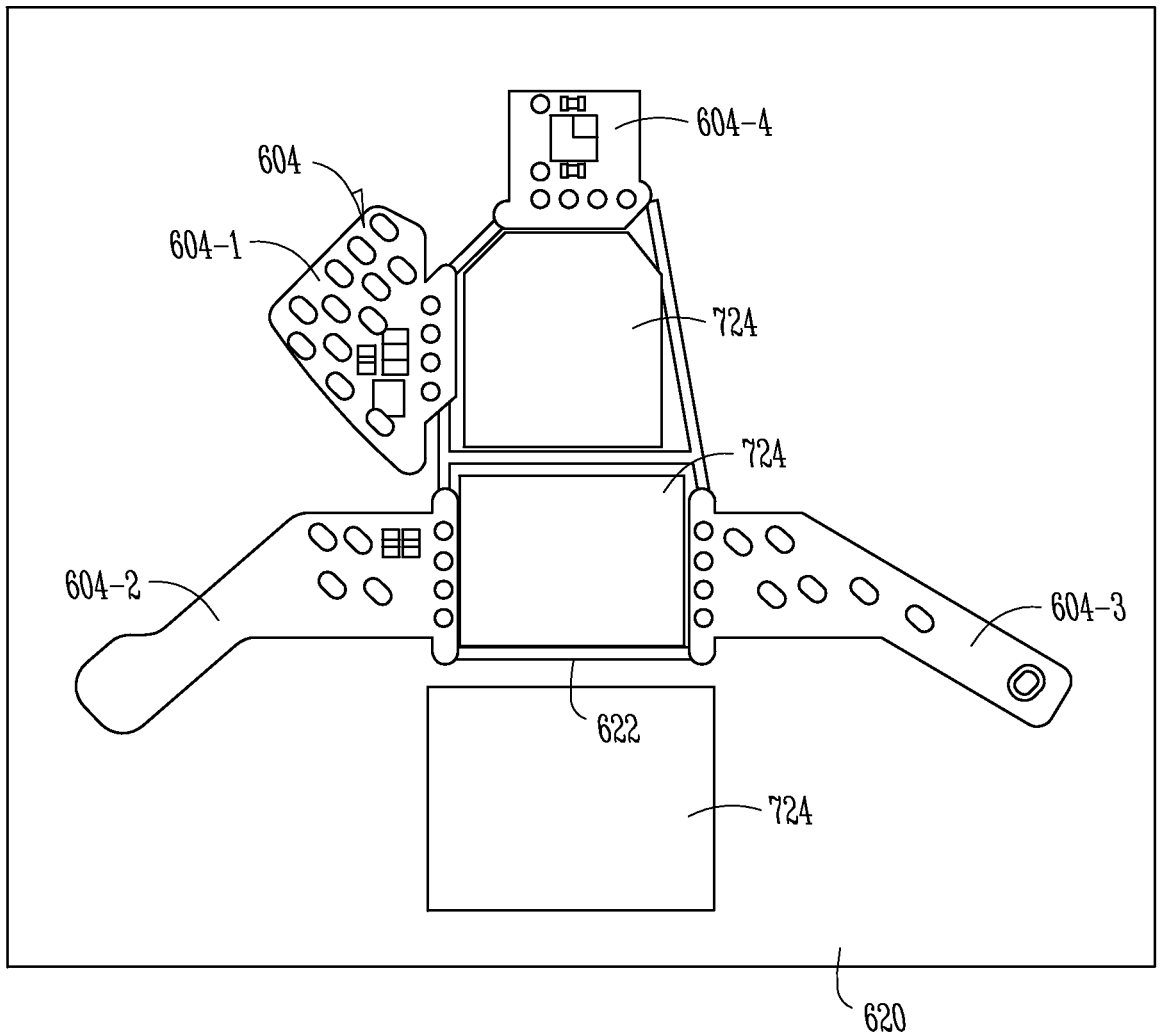
FIG. 7 is an illustration of an embodiment of the set of peripheral boards on the flexible circuit panel with open areas to form a framework upon which the motherboard can rest.

FIG. 7 is an illustration of an embodiment of the set of peripheral boards 604 on panel 620 with open areas 724. Panel 620 has areas laser routed such that they may be completely removed, leaving open areas 724. Open areas 724 are strategically placed such that when motherboard 502 is placed upon the framework formed by peripheral boards 604 on panel 620, components protruding from the underside of motherboard 502 can pass unencumbered by panel 620.

Figure 8:
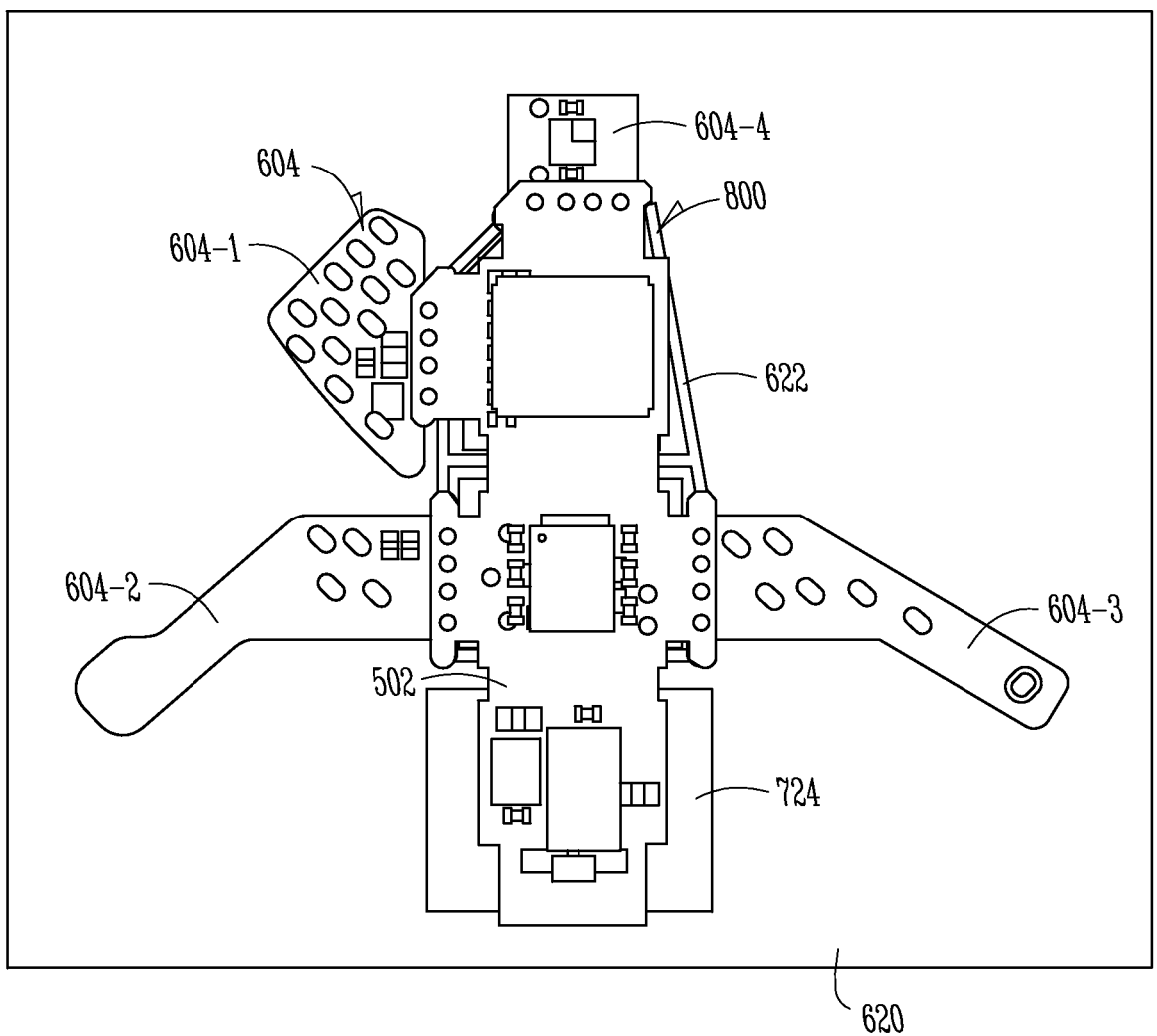
FIG. 8 is an illustration of an embodiment of the motherboard placed on the framework.

FIG. 8 is an illustration of an embodiment of motherboard 502 attached to set of peripheral board 604 to form a flexible circuit board assembly 800 that implements the hearing aid circuit. When motherboard 502 is placed upon the framework formed by peripheral boards 604 on panel 620, electrical connection points of motherboard 502 and electrical connection points of peripheral boards 604 are aligned, i.e., substantially share the same coordinates. Solder paste is applied, such as by printing, onto the electrical connection points of peripheral boards 604 on panel 620. The layout of peripheral boards 604 within panel 620 is a unique aspect of the present subject matter. Once motherboard 502 is placed upon the framework formed by peripheral boards 604 on panel 620, heat is applied to at least portions of flexible circuit board assembly 800 to complete the electrical connections.

Figure 9:
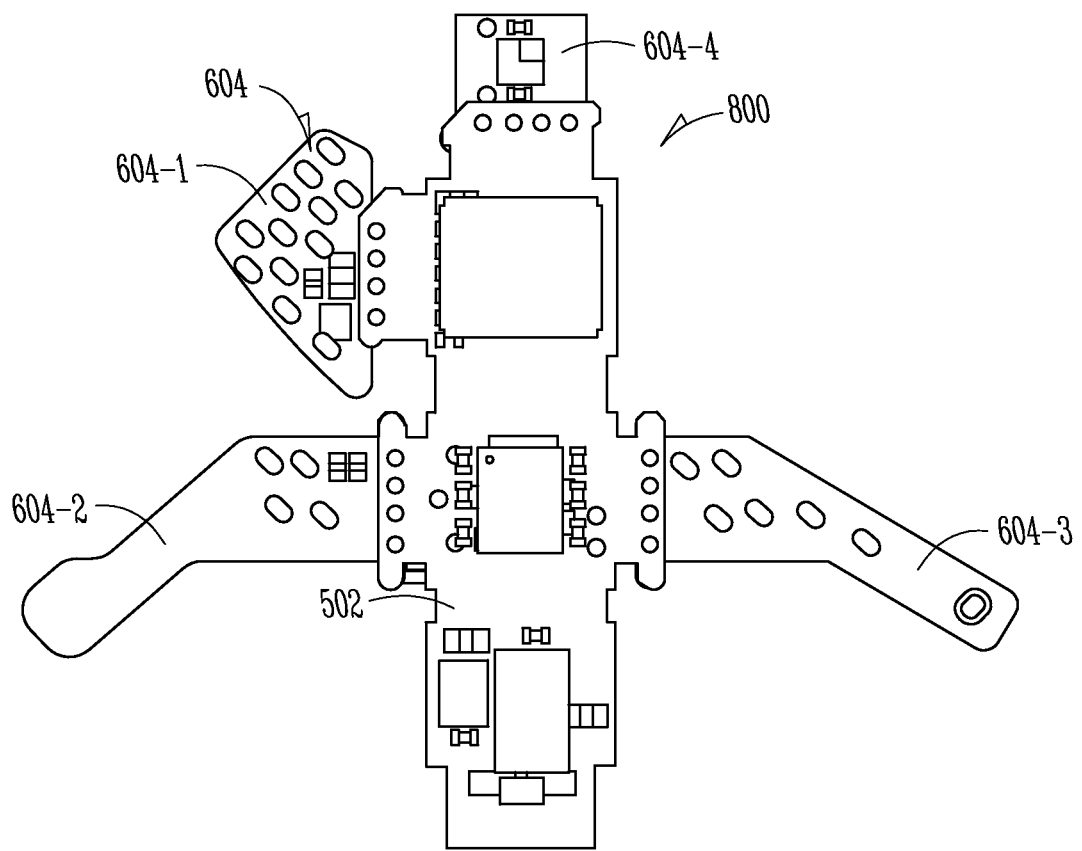
FIG. 9 is an illustration of an embodiment of a flexible circuit board assembly including the motherboard attached to the set of peripheral boards.

FIG. 9 is an illustration of an embodiment of flexible circuit board assembly 800, which includes at least portions of the circuit for a hearing aid, after being excised and lifted from panel 620. Once the electrical connections have been made using the SMT process, flexible circuit board assembly 800, which includes motherboard 502 and peripheral boards 604 held together by the plurality of non-laser-routed tabs is ready for excising by cutting the tabs using laser routing or other suitable means.

Figure 10:
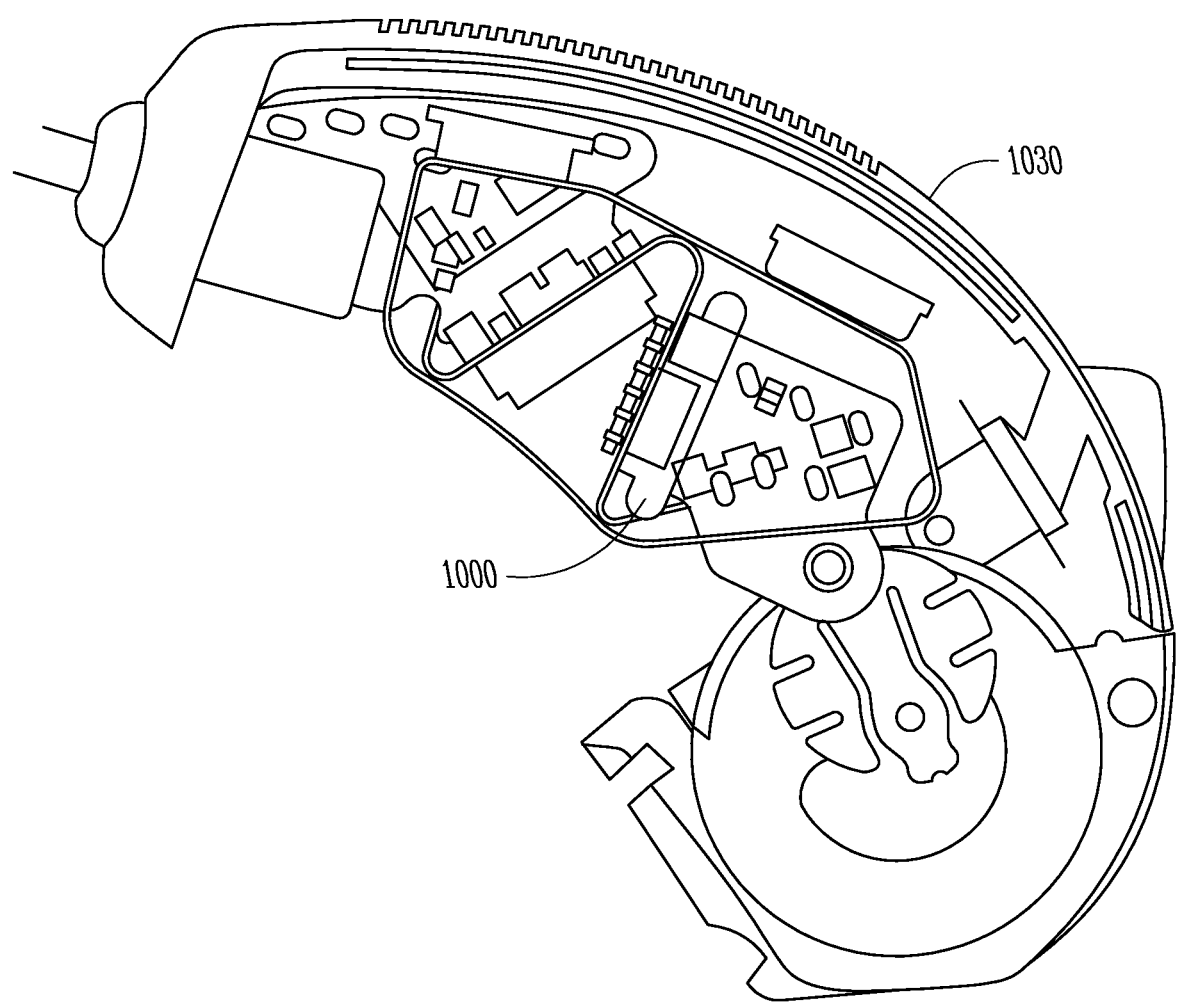
FIG. 10 is an illustration of an embodiment of a flexible circuit board assembly for a behind-the-ear (BTE) hearing aid.
Figure 11:
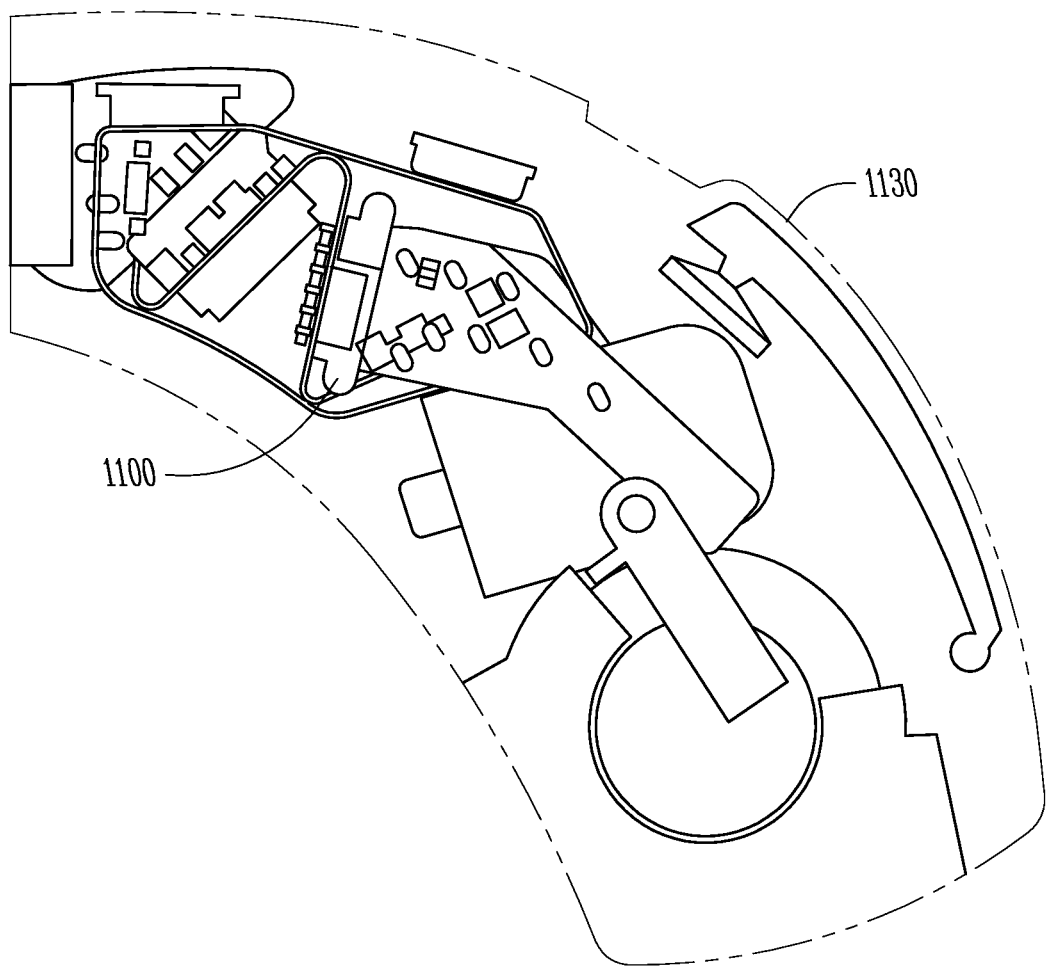
FIG. 11 is an illustration of an embodiment of a flexible circuit board assembly for a receiver-in-canal (RIC) hearing aid.

FIG. 10 is an illustration of an embodiment of a flexible circuit board assembly 1000 to be housed in the case of a behind-the-ear (BTE) style hearing aid 1030. FIG. 11 is an illustration of an embodiment of a flexible circuit board 1100 assembly to be housed in the case of a receiver-in-canal (RIC) style hearing aid 1130. Flexible circuit board assemblies 1000 and 1100 share the same mother board design and are each an example of flexible circuit board assembly 200 constructed using method 400, including the automated assembly process illustrated in FIGS. 5-9 for completing flexible circuit board assembly 800. Many standard hearing aid styles for a given hearing aid generation can use the same motherboard. Peripheral boards specific to each hearing aid style will provide the necessary connections. For example, a BTE style hearing aid requires longer arms (peripheral boards) to attach the motherboard to the battery contacts, as the style is slightly larger, whereas a RIC style hearing aid requires shorter arms (peripheral boards). Individual arms (peripheral boards) are easier to design and modify as needed, when compared to designing and modifying a complete hearing aid circuit, or a major portion of the circuit, that is constructed as a single circuit board.

Figure 12:
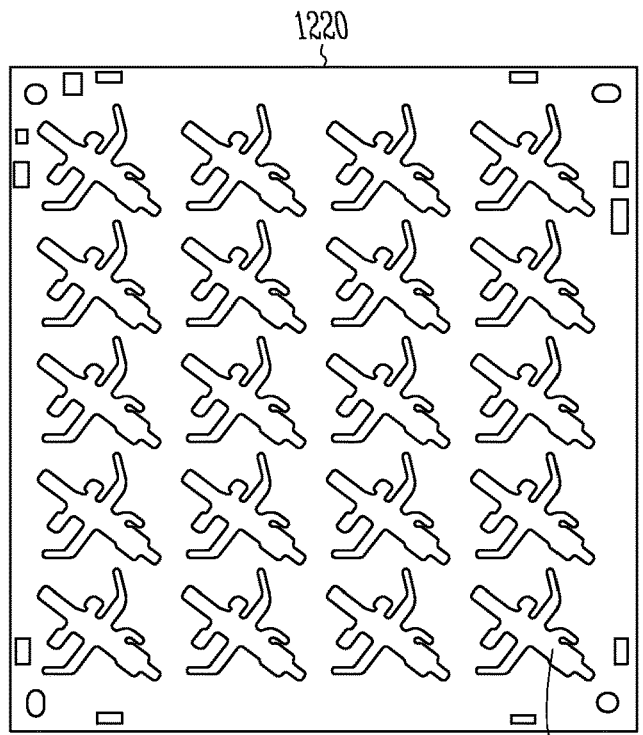
FIG. 12 is an illustration of a flexible circuit panel for making the circuit of FIG. 9 as a single flexible circuit board.
Figure 13:
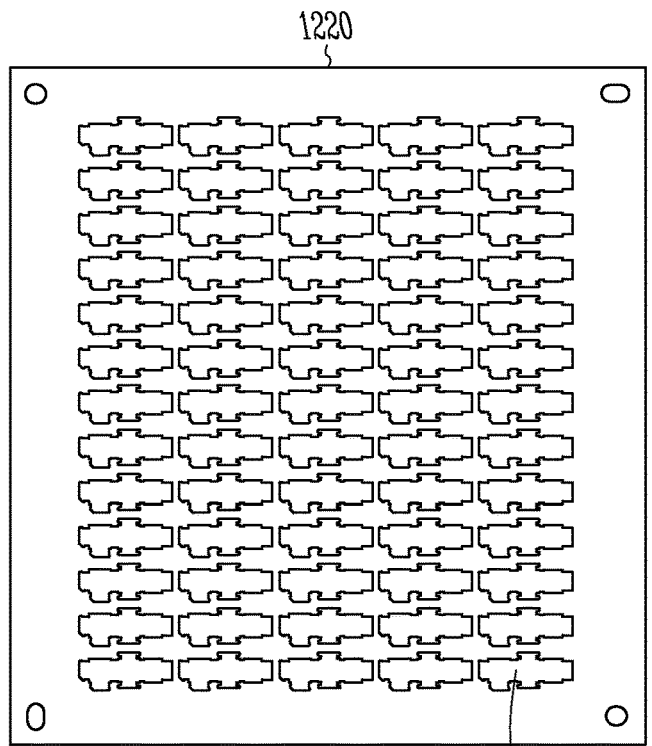
FIG. 13 is an illustration of a flexible circuit panel for making the motherboard of the circuit of FIG. 9.

FIG. 12 is an illustration of a flexible circuit panel 1220 for making the circuit of FIG. 9 (flexible circuit board assembly 800, which includes motherboard 502) as a single-board flexible circuit 1200. Panel 1220 is a four-layer flexible circuit panel, as required for routing the portion of circuit 1200 corresponding to motherboard 502. FIG. 13 is an illustration of panel 1220 for making motherboard 502. As illustrated in FIGS. 12 and 13, the present subject matter allows many more motherboards to fit onto a flexible circuit panel. The cost saving is significant particularly with the much more efficient use of space on a flexible circuit panel having three, four, or more layers.

Figure 14:
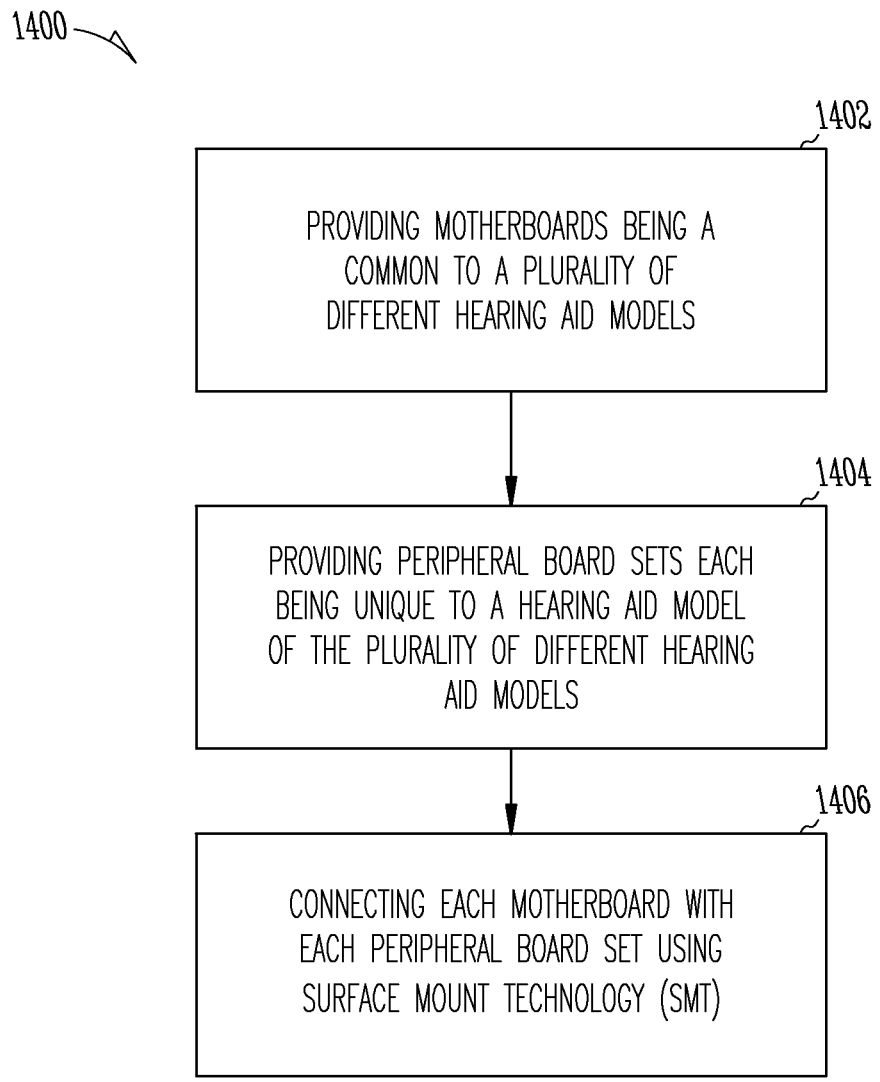
FIG. 14 is a flow chart illustrating an embodiment of a method for making electronic circuits for a plurality of different hearing aid models.

FIG. 14 is a flow chart illustrating an embodiment of a method 1400 for making electronic circuits for a plurality of different hearing aid models. Method 1400 represents an application of method 400 for making hearing aid circuits for the plurality of different hearing aid models. In various embodiments, the different hearing aid models may include hearing aids of different physical styles (such as BTE and RIC styles) and/or different functions.

At 1402, motherboards are provided. The motherboards each include a mother circuit constructed as a flexible circuit board and are common to the plurality of different hearing aid models. Examples of the motherboards include, but are not limited to, motherboards 202 and 502 as discussed in this document.

At 1404, peripheral board sets are provided. The peripheral board sets each include one or more peripheral circuits constructed as one or more flexible circuit boards and are each unique to a hearing aid model of the plurality of different hearing aid models. Examples of the peripheral board sets include, but are not limited to, peripheral boards 204 and 604 as discussed in this document.

At 1406, each motherboard of the motherboards is connected with each peripheral board set of the peripheral board sets using SMT. In one embodiment, each peripheral board set is arranged on a flexible circuit panel in a way forming a framework upon which a motherboard can rest. The motherboard is placed on the framework and SMT is applied to attach the motherboard to the framework of the peripheral board set.

The present subject matter will lead to substantial time and cost savings in the development and manufacturing of flexible circuits for hearing aids, when compared to a single-board approach or manually assembled modular boards. A single motherboard design can be used with many hearing aid circuit designs, while different peripheral boards provide different hearing aids with different physical and/or functional features. Fewer three-layer or four-layer flexible circuit panels will be needed as more motherboards fit onto each flexible circuit panel while the peripheral boards can be built using the less expensive one-layer or two-layer flexible boards.

It is understood that the hearing aids referenced in this patent application include a processor (such as part of processing circuit 314). The processor may be a digital signal processor (DSP), microprocessor, microcontroller, or other digital logic. The processing of signals referenced in this application can be performed using the processor. Processing may be done in the digital domain, the analog domain, or combinations thereof. Processing may be done using subband processing techniques. Processing may be done with frequency domain or time domain approaches. For simplicity, in some examples blocks used to perform frequency synthesis, frequency analysis, analog-to-digital conversion, amplification, and certain types of filtering and processing may be omitted for brevity. In various embodiments the processor is adapted to perform instructions stored in memory which may or may not be explicitly shown. In various embodiments, instructions are performed by the processor to perform a number of signal processing tasks. In such embodiments, analog components are in communication with the processor to perform signal tasks, such as microphone reception, or receiver sound embodiments (i.e., in applications where such transducers are used). In various embodiments, realizations of the block diagrams, circuits, and processes set forth herein may occur without departing from the scope of the present subject matter.

The present subject matter is demonstrated for hearing assistance devices, including hearing aids, including but not limited to, behind-the-ear (BTE), in-the-ear (ITE), in-the-canal (ITC), receiver-in-canal (RIC), or completely-in-the-canal (CIC) type hearing aids. It is understood that behind-the-ear type hearing aids may include devices that reside substantially behind the ear or over the ear. Such devices may include hearing aids with receivers associated with the electronics portion of the behind-the-ear device, or hearing aids of the type having receivers in the ear canal of the user, including but not limited to receiver-in-canal (RIC) or receiver-in-the-ear (RITE) designs. The present subject matter can also be used in hearing assistance devices generally, such as cochlear implant type hearing devices. It is understood that other hearing assistance devices not expressly stated herein may be used in conjunction with the present subject matter.

This application is intended to cover adaptations or variations of the present subject matter. It is to be understood that the above description is intended to be illustrative, and not restrictive. The scope of the present subject matter should be determined with reference to the appended claims, along with the full scope of legal equivalents to which such claims are entitled.

What is claimed is:

1. A method for making a hearing aid, comprising:
constructing a hearing aid circuit as a plurality of circuit boards including a motherboard including motherboard electrical connection points and a plurality of peripheral boards including peripheral board electrical connection points, the hearing aid circuit including a mother circuit and peripheral circuits, the motherboard being a multi-layer flexible circuit board including the mother circuit being an electronic circuit built on a flexible substrate, the plurality of peripheral boards including the peripheral circuits and constructed on a flexible circuit panel to form a framework having open areas positioned to accommodate components of the mother circuit on the motherboard to allow for placement of the motherboard on the framework, the mother circuit including a substantial portion of a processing circuit of the hearing aid circuit;
placing the motherboard on the framework with the motherboard electrical connection points aligned with the peripheral board electrical connection points; and
attaching each circuit board of the plurality of peripheral boards to the motherboard using a surface mount technology (SMT) with reflow soldering such that the each circuit board is connected to the motherboard by solder at the aligned motherboard electrical connection points and peripheral board electrical connection points.

2. The method of claim 1, comprising constructing the as a multi-layer flexible circuit board having at least three layers.

3. The method of claim 2, comprising constructing each circuit board of the plurality of peripheral boards as a flexible circuit board.

4. The method of claim 1, wherein constricting the hearing aid circuit comprises constructing the motherboard as a multi-layer flexible circuit board including at least three layers.

5. The method of claim 4, wherein constructing the hearing aid circuit comprises constructing the one or more peripheral circuits each as a flexible circuit board including one or two layers.

6. The method of claim 1, wherein the mother circuit comprises a digital signal processor (DSP).

7. The method of claim 6, wherein constructing the mother circuit comprises including the substantial portion of the processing circuit and a substantial portion of a communication circuit of the hearing aid circuit as part of the mother circuit, the communication circuit configured to allow the hearing aid to wirelessly communicate with another device.

8. A method for making different electronic circuits for a plurality of different hearing aid models, comprising:
providing motherboards each including a mother circuit and constructed as a multi-layer flexible circuit board including an electronic circuit built on a flexible substrate, the motherboards being common to the plurality of different hearing aid models;
providing peripheral board sets each including peripheral circuit boards, the peripheral circuit boards including peripheral circuits and constructed on a flexible circuit panel to form a framework with open areas positioned to accommodate components of a motherboard of the motherboards to allow for placement of the motherboard on the framework, the peripheral board sets including a plurality of different types each being unique to a hearing aid model of the plurality of different hearing aid models; and connecting each motherboard of the motherboards with each peripheral board set of the peripheral board sets using a surface mount technology (SMT), including:
placing the each motherboard on the framework formed by the peripheral circuit boards of the each peripheral board set with electrical connection points of the each motherboard aligned with electrical connection points of the each peripheral board set; and
attaching the each motherboard to each peripheral board of the each peripheral board set using reflow soldering.

9. The method of claim 8, further comprising constructing the motherboards each as a multi-layer flexible circuit board including at least three layers.

10. The method of claim 9, comprising constructing the motherboards each as a multi-layer flexible circuit board including four layers.

11. The method of claim 10, comprising constructing the peripheral board sets each as one or more flexible circuit boards each including one or two layers.

12. The method of claim 8, further comprising including a substantial portion of a processing circuit of a hearing aid in the mother circuit.

13. The method of claim 12, further comprising including a substantial portion of a communication circuit of the hearing aid in the mother circuit, the communication circuit configured to allow the hearing aid to wirelessly communicate with another device.

14. The method of claim 12, wherein including the substantial portion of the processing circuit comprises including a digital signal processor (DSP).

15. A hearing aid, comprising:
a hearing aid circuit including a plurality of sub-circuits each constructed as a circuit board of a plurality of circuit boards, the plurality of sub-circuits including a mother circuit and a plurality of peripheral circuits, the plurality of circuit boards including a motherboard having motherboard electrical connection points and a plurality of peripheral boards having peripheral board electrical connection points, the mother circuit including a substantial portion of a processing circuit, the motherboard being a multi-layer flexible circuit board including the mother circuit being an electronic circuit built on a flexible substrate, the plurality of peripheral boards including the peripheral circuits, constructed on a flexible circuit panel to form a framework, and attached to the motherboard by placing the motherboard on the framework with the motherboard electrical connection points aligned with the peripheral board electrical connection points and applying a surface mount technology (SMT) including reflow soldering at the aligned motherboard electrical connection points and peripheral board electrical connection points such that each peripheral board of the plurality of peripheral boards is connected to the motherboard, the framework having open areas positioned to accommodate components of the mother circuit on the motherboard when the motherboard is placed on the framework; and
a hearing aid case housing the plurality of sub-circuits.

16. The hearing aid of claim 15, wherein the mother circuit comprises a digital signal processor (DSP).

17. The hearing aid of claim 16, wherein the hearing aid circuit further comprises a communication circuit configured to perform wireless communication of the hearing aid, and the mother circuit further comprises a substantial portion of the communication circuit.

18. The hearing aid of claim 16, wherein the motherboard has an approximately rectangular shape.

19. The hearing aid of claim 16, wherein the peripheral boards each comprise a flexible circuit board.

20. The hearing aid of claim 19, wherein the motherboard comprises a multi-layer flexible circuit board including at least three layers.

21. The hearing aid of claim 16, wherein the motherboard comprises a multi-layer flexible circuit board including at least three layers.

22. The hearing aid of claim 21, wherein the peripheral boards each comprise a single-layer flexible circuit board or a two-layer flexible circuit board.

23. The hearing aid of claim 15, wherein the hearing aid case is configured to be a case for a behind-the-ear (BTE) type hearing aid.

24. The hearing aid of claim 15, wherein the hearing aid case is configured to be a case for an in-the-ear (ITE) type hearing aid.

* * * * *